United States Patent
Yoshimoto

(10) Patent No.: US 12,429,773 B2
(45) Date of Patent: Sep. 30, 2025

(54) FLEXOGRAPHIC PRINTING PLATE PRECURSOR

(71) Applicant: TOYOBO CO., LTD., Osaka (JP)

(72) Inventor: Kazuya Yoshimoto, Okayama (JP)

(73) Assignee: TOYOBO MC CORPORATION, Osaka (JP)

( * ) Notice: Subject to any disclaimer, the term of this patent is extended or adjusted under 35 U.S.C. 154(b) by 681 days.

(21) Appl. No.: 17/640,849

(22) PCT Filed: Sep. 9, 2020

(86) PCT No.: PCT/JP2020/034149
§ 371 (c)(1),
(2) Date: Mar. 7, 2022

(87) PCT Pub. No.: WO2021/054225
PCT Pub. Date: Mar. 25, 2021

(65) Prior Publication Data
US 2022/0342310 A1 Oct. 27, 2022

(30) Foreign Application Priority Data
Sep. 20, 2019 (JP) .................. 2019-171534

(51) Int. Cl.
*G03F 7/095* (2006.01)
*B41N 1/12* (2006.01)

(52) U.S. Cl.
CPC .............. *G03F 7/095* (2013.01); *B41N 1/12* (2013.01)

(58) Field of Classification Search
CPC ....................................................... G03F 7/11
See application file for complete search history.

(56) References Cited

U.S. PATENT DOCUMENTS

| | | |
|---|---|---|
| 2004/0197706 A1 | 10/2004 | Wada et al. |
| 2019/0265591 A1 | 8/2019 | Ido et al. |
| 2019/0375227 A1* | 12/2019 | Matsuo ............ B41F 5/24 |
| 2022/0283502 A1* | 9/2022 | Yoshimoto ............ G03F 7/2022 |

FOREIGN PATENT DOCUMENTS

| | | | |
|---|---|---|---|
| EP | 4019254 A1 | 6/2022 | |
| JP | 2004-317964 A | 11/2004 | |
| JP | 2005-289041 A | 10/2005 | |
| JP | 2007-079203 A | 3/2007 | |
| JP | 2009139599 A * | 6/2009 | ............. H01M 6/08 |
| JP | 4610132 B2 | 1/2011 | |
| JP | 2013114136 A * | 6/2013 | |
| WO | 2018/088336 A1 | 5/2018 | |
| WO | WO-2018181354 A1 * | 10/2018 | ............... B41F 5/24 |

OTHER PUBLICATIONS

Machine English Translation of JP 2009139599 A (Year: 2025).*
Notification of Transmittal of Copies of Translation of the International Preliminary Report on Patentability (Form PCT/IB/338) issued in counterpart International Application No. PCT/JP2020/034149 mailed Mar. 31, 2022, with Forms PCT/IB/373 and PCT/ISA/237. (5 pages).
International Search Report dated Dec. 1, 2020, issued in counterpart Application No. PCT/JP2020/034149. (2 pages).
Office Action dated Mar. 25, 2023, issued in counterpart CN Application No. 202080065388.7, with English machine Translation. (20 pages).
Extended (Supplementary)European Search Report dated Mar. 31, 2023, issued in counterpart EP Application No. 20865809.6. (9 pages).

* cited by examiner

*Primary Examiner* — Chanceity N Robinson
(74) *Attorney, Agent, or Firm* — WHDA, LLP

(57) ABSTRACT

A flexographic printing plate precursor is disclosed in which the size and the number of pinholes in a heat-sensitive mask layer are reduced in a simple manner, and to provide a flexographic printing plate almost free from disadvantages caused by the pinholes, based on the flexographic printing plate precursor. A flexographic printing plate precursor comprising at least a support (A), a photosensitive resin layer (B), a heat-sensitive mask layer (C) and a cover film (D) which are laminated in this order, characterized in that the surface energy and the surface roughness (Ra) of a surface of the cover film (D) which contacts with the heat-sensitive mask layer (C) are 25.0 to 40.0 mN/m and 0.01 to 0.2 μm, respectively, and that a protection layer (E) formed from a polymer compound dispersible in a developing solution is provided between the photosensitive resin layer (B) and the heat-sensitive mask layer (C).

5 Claims, No Drawings

FLEXOGRAPHIC PRINTING PLATE PRECURSOR

TECHNICAL FIELD

The present invention relates to a flexographic printing plate in which the size and the number of the pinholes in the heat-sensitive mask layer are reduced.

BACKGROUND ART

Flexographic printing is a printing method in which an ink is applied onto convex parts on a printing plate and then the printing plate is pressed against a substrate so as to transfer the ink from the printing plate to the substrate. A printing plate used in flexographic printing is relatively soft and can fit to various shapes, and therefore makes it possible to print on wide varieties of substrates. Examples of the substrate include a packaging film, label paper, drink carton, a paper-made container, an envelope and cardboard. Particularly for a substrate having a rough surface, flexographic printing is mainly employed. Furthermore, flexographic printing can utilize a water-based or alcohol-based ink from which the emission amount of VOCs (volatile organic compounds) is small. Therefore, flexographic printing is a highly environment-friendly printing method. Due to the above-mentioned advantages, i.e., the adaptability to substrates and the environmental friendliness, gravure printing and offset printing are increasingly shifting to flexographic printing.

In the shift from gravure printing or offset printing to flexographic printing, high printing quality is required in flexographic printing. As to one technique for improving the quality of flexographic printing, a microcell has been used. When a microcell is used, a microcell pattern is imaged on a heat-sensitive mask layer and then an imaged pattern is reproduced on a printing plate through an exposure step and a developing step. It is important to precisely reproduce the imaged pattern formed on the heat-sensitive mask layer onto the printing plate. Therefore, there has been made an effort to suppress the occurrence of oxygen-induced polymerization inhibition in the photosensitive resin layer so as to precisely reproduce the imaged pattern formed on the heat-sensitive mask layer onto the printing plate.

Meanwhile, when the imaged pattern on the heat-sensitive mask layer is precisely reproduced onto the printing plate, fine pinholes in the heat-sensitive mask layer became to be a problem, though they have not been a problem in the past. As to a means for suppressing the pinholes, a method has been proposed in which a mask layer is formed on the surface of a cover film and then a release film is attached for the purpose of protecting the mask layer, and the release film is detached upon the processing to produce a printing plate (see Patent Document 1). This method is effective for the suppression of pinholes that occurs upon the contact with a roll. However, in this method, it is necessary to attach and detach the release film. Therefore the process becomes complicated.

In these situations, a flexographic printing plate precursor has been still keenly demanded which enables the reduction of the size and the number of pinholes in a heat-sensitive mask layer in a simple manner.

PRIOR ART DOCUMENTS

Patent Documents

Patent Document 1: Japanese Patent No. 4610132

DISCLOSURE OF THE INVENTION

Problem that the Invention is to Solve

The present invention has been made in these situations. The object of the present invention is to provide a flexographic printing plate precursor in which the size and the number of pinholes in a heat-sensitive mask layer are reduced in a simple manner, and to provide a flexographic printing plate almost free from disadvantages caused by the pinholes, based on the flexographic printing plate precursor.

Means for Solving the Problem

The present inventors have made extensive and intensive studies for achieving the object. As a result, it was found that: in a flexographic printing plate precursor comprising at least a support, a photosensitive resin layer, a heat-sensitive mask layer and a cover film which are laminated in this order, by adjusting the surface energy and the surface roughness (Ra) of a surface of the cover film which contacts with the heat-sensitive mask layer to specific ranges, and by providing a protection layer formed from a polymer compound dispersible in a developing solution between the photosensitive resin layer and the heat-sensitive mask layer, it is possible to easily provide a flexographic printing plate precursor in which the size and the number of pinholes in a heat-sensitive mask layer are reduced; and as a result, a flexographic printing plate almost free from disadvantages caused by the pinholes can be provided.

In summary, the present invention has the following configurations (1) to (5).

(1) A flexographic printing plate precursor comprising at least a support (A), a photosensitive resin layer (B), a heat-sensitive mask layer (C) and a cover film (D) which are laminated in this order, characterized in that the surface energy and the surface roughness (Ra) of a surface of the cover film (D) which contacts with the heat-sensitive mask layer (C) are 25.0 to 40.0 mN/m and 0.01 to 0.2 μm, respectively, and that a protection layer (E) formed from a polymer compound dispersible in a developing solution is provided between the photosensitive resin layer (B) and the heat-sensitive mask layer (C).

(2) The flexographic printing plate precursor according to (1), wherein pinholes each having a size of 7,000 μm$^2$ or more do not exist in the heat-sensitive mask layer (C), and wherein the number of pinholes each having a size of 2,000 μm$^2$ or more and less than 7,000 μm$^2$ is 5 pinholes/m$^2$ or less in the heat-sensitive mask layer (C).

(3) A flexographic printing plate obtained from the flexographic printing plate precursor according to (1) or (2).

(4) The flexographic printing plate according to (3), wherein the flexographic printing plate has been obtained by developing the flexographic printing plate precursor using a water-based developing solution.

(5) A method for producing a printed matter, characterized in that the method uses the flexographic printing plate according to (3) or (4).

Advantages of the Invention

In the flexographic printing plate precursor according to the present invention, the surface energy and the surface roughness (Ra) of a surface of a cover film which contacts with a heat-sensitive mask layer are adjusted to specific ranges, and a protection layer formed from a polymer compound dispersible in a developing solution is provided between a photosensitive resin layer and the heat-sensitive mask layer. Therefore, the flexographic printing plate precursor in which the size and the number of the pinholes in the heat-sensitive mask layer are reduced can be produced easily. As a result, a flexographic printing plate almost free from disadvantages caused by pinholes can be provided.

BEST MODE FOR CARRYING OUT THE INVENTION

The flexographic printing plate precursor according to the present invention is a flexographic printing plate precursor comprising at least a support (A), a photosensitive resin layer (B), a heat-sensitive mask layer (C) and a cover film (D) which are laminated in this order, characterized in that the surface energy and the surface roughness (Ra) of a surface of the cover film (D) which contacts with the heat-sensitive mask layer (C) are 25.0 to 40.0 mN/m and 0.01 to 0.2 μm, respectively, and that a protection layer (E) formed from a polymer compound dispersible in a developing solution is provided between the photosensitive resin layer (B) and the heat-sensitive mask layer (C). When the surface energy and the surface roughness of a surface of the cover film (D) which contacts with a heat-sensitive mask layer (C) are adjusted to specific ranges and a specific protection layer (E) is provided on a surface of the heat-sensitive mask layer (C) which is opposed to a surface thereof contacting with the cover film (D), it becomes possible to produce almost no pinholes in the printing plate precursor during the application of the heat-sensitive mask layer (C) or during the processing of the heat-sensitive mask layer (C).

The (A) support used in flexographic printing plate precursor is preferably made from a material being flexible and having a superior dimension stability. Examples thereof include: a support made of metal, such as steel, aluminum, copper and nickel, and a support made of a thermoplastic resin, such as a polyethylene terephthalate film, a polyethylene naphthalate film, a polybutylene terephthalate film and a polycarbonate film. Among these, the polyethylene terephthalate film, which has the superior dimension stability and a sufficiently high viscoelasticity, is in particular preferably used. A thickness of the support is set to 50 to 350 μm, preferably, to 100 to 250 μm, from viewpoints of mechanical properties, shape stability and handling characteristics during manufacturing of a printing plate. Moreover, if necessary, an adhesive may be arranged between the support (A) and the photosensitive resin layer (B) in order to improve an adhesive property between them.

The photosensitive resin composition constituting the photosensitive resin layer (B) used in flexographic printing plate precursor is not particularly limited. In general, it may comprise (a) a polymer prepared by polymerizing a conjugated diene, (b) an ethylenically unsaturated compound and (c) a photopolymerization initiator, and if necessary, may comprise an additive such as a plasticizer, a hydrophilic compound, an ultraviolet ray absorber, a surface tension modulator, a thermal polymerization inhibitor, a dye, a pigment, a flavoring agent, and an antioxidant agent.

As to the polymer prepared by polymerizing the conjugated diene (a), a conventional known synthetic polymer compound that has been used in a printing plate precursor can be used. Examples of the polymer include a polymer prepared by polymerizing a conjugated diene hydrocarbon and a copolymer prepared by copolymerizing a conjugated diene hydrocarbon and a monoolefin unsaturated compound. Specific examples of the polymer include a butadiene polymer, an isoprene polymer, a chloroprene polymer, a styrene-butadiene copolymer, a styrene-butadiene-styrene copolymer, a styrene-isoprene copolymer, a styrene-isoprene-styrene copolymer, a styrene-chloroprene copolymer, an acrylonitrile-butadiene copolymer, an acrylonitrile-isoprene copolymer, a (methyl methacrylate)-butadiene copolymer, a (methyl methacrylate)-isoprene copolymer, an acrylonitrile-butadiene-styrene copolymer, and an acrylonitrile-isoprene-styrene copolymer. Among these polymers, a butadiene polymer is preferably used, from the viewpoint of the properties of flexographic printing plates, i.e., repulsion elasticity of a surface of a printing plate, high elongation properties, resin plate hardness, dimensional stability during unexposed state, and easy availability. These polymers may be used singly, or two or more of them may be used in combination. It is preferred that the content of the component (a) in the photosensitive resin composition that forms the photosensitive resin layer (B) is within the range of 40 to 70% by mass.

As to the ethylenically unsaturated compound (b), a conventional known one that has been used in a printing plate precursor can be used. Examples thereof include liner, branched or cyclic monofunctional monomers such as hexyl (meth)acrylate, nonane (meth)acrylate, lauryl (meth)acrylate, stearyl (meth)acrylate, 2-ethyl, 2-butylpropanediol (meth)acrylate, hydroxyethyl (meth)acrylate, 2-(meth)acryloyloxyethyl hexahydrophtalate, 2-(meth)acryloyloxyethyl phtalate, a (meth)acrylic acid dimer, ECH denatured allyl acrylate, benzyl acrylate, caprolactone (meth)acrylate, dicyclopentenyl (meth)acrylate, isobornyl (meth)acrylate and cyclohexyl (meth)acrylate. The examples also include linear branched or cyclic polyfunctional monomers such as hexanediol di(meth)acrylate, nonanediol di(meth)acrylate, 2-butyl-2-ethylpropanediol di(meth)acrylate, neopentyl glycol di(meth)acrylate, neopentylglycol hydroxypivalate di(meth)acrylate, ECH denatured phthalic acid di(meth) acrylate, dicyclopentadiene di(meth)acrylate, tricyclodecanedimethanol di(meth)acrylate, trimethylolpropane tri (meth)acrylate, pentaerythritol tri(meth)acrylate, ECH denatured glycerol tri(meth)acrylate, trimethylolpropane benzoate (meth)acrylate, EO(PO) denatured trimethylolpropane tri(meth)acrylate, dipentaerythritol hexa(meth)acrylate, a product prepared by adding a (meth)acrylate group to butadiene oligomer or isoprene oligomer, and urethane (meth)acrylate. These compounds may be used singly. Alternatively, two or more of them may be used in combination for the purpose of imparting a desired resin property. It is preferred that the content of the component (b) in the photosensitive resin composition that forms the photosensitive resin layer (B) is within the range of 10 to 50% by mass.

As to the photopolymerization initiator (c), a conventional known one that has been used in a printing plate precursor can be used. Examples of the photopolymerization initiator (c) include a benzophenone compound, a benzoin compound, an acetophenone compound, a benzyl compound, a benzoin alkyl ether compound, a benzyl alkyl ketal compound, an anthraquinone compound and a thioxanthone compound. It is preferred that the content of the component (c) in the photosensitive resin composition that forms the photosensitive resin layer (B) is within the range of 1 to 10% by mass.

As to the heat-sensitive mask layer (C) used in the flexographic printing plate precursor, any conventional one which has been used in a printing plate precursor can be used. For example, the heat-sensitive mask layer is preferably composed of carbon black (which is a material having the function to absorb infrared ray laser so as to convert the absorbed infrared ray laser to heat and the function to block ultraviolet ray), a dispersion binder for carbon black, and a binder polymer capable of forming a coating film. The dispersion binder may double with the binder polymer capable of forming a coating film. Furthermore, an auxiliary component other than the above-mentioned components, e.g., a pigment dispersing agent, a filler, a surfactant and a coating aid, may be contained, as long as the effects of the present invention cannot be deteriorated.

The heat-sensitive mask layer (C) used in the flexographic printing plate precursor of the present invention is preferably developable with water. Examples of the heat-sensitive mask layer (C) include: a heat-sensitive mask layer containing a combination of a polyamide containing a polar group and a butyral resin (Japanese Patent No. 4200510); a heat-sensitive mask layer containing a polymer having the same structure as that of the polymer in the photosensitive resin layer and an acrylic resin (Japanese Patent No. 5710961); a heat-sensitive mask layer containing an anionic polymer and a polymer having an ester group in a side chain thereof and having a saponification degree of 0 to 90% inclusive (Japanese Patent No. 5525074); and a heat-sensitive mask layer containing a combination of a methoxymethylated polyamide resin and a water-soluble polyamide resin having a basic nitrogen atom in a molecule (Japanese Patent No. 6358523).

The (D) cover film used in flexographic printing plate precursor of the present invention is preferably made from a material being flexible and having a superior dimension stability. Examples thereof include: a support made of a thermoplastic resin, such as a polyethylene terephthalate film, a polyethylene naphthalate film, and a polybutylene terephthalate film. Among these, the polyethylene terephthalate film, which has the superior dimension stability and a sufficiently high viscoelasticity, is in particular preferably used. A thickness of the cover film (D) is set preferably to 50 to 350 μm, and more preferably to 100 to 250 μm, from viewpoints of mechanical properties, shape stability and handling characteristics during manufacturing of a printing plate.

The flexographic printing plate precursor of the present invention has a feature that the surface energy and the surface roughness (Ra) of a surface of a cover film (D) which contacts with a heat-sensitive mask layer (C) are 25.0 to 40.0 mN/m and 0.01 to 0.2 μm, respectively. Preferably, the surface energy is 25.0 to 39.0 mN/m and the surface roughness (Ra) is 0.02 to 0.18 μm.

If the surface energy of the cover film (D) is less than the above-mentioned range, the wettability of a liquid cannot be secured during the application of the heat-sensitive mask layer (C) over the cover film (D), and therefore the formation of pinholes cannot be suppressed fully. Furthermore, the adhesion force between the heat-sensitive mask layer (C) and the cover film (D) is insufficient, and therefore the detachment between these layers during the production of the printing plate precursor cannot be suppressed. In general, in the process for producing a printing plate precursor, a heat-sensitive mask layer (C) provided on a surface of the cover film (D) contacts with a plurality of rolls and, as a result, the heat-sensitive mask layer (C) is scratched upon the contact with the rolls, resulting in the formation of pinhole. When the surface energy of the cover film (D) is adjusted to the above-mentioned range, it becomes possible to detach the cover film (D) from the printing plate precursor properly during the production of a printing plate. If the surface energy is more than the above-mentioned range, the adhesion force between the heat-sensitive mask layer (C) and the cover film (D) is too strong, and therefore a portion of the heat-sensitive mask layer (C) may be transfer to the cover film (D) side upon the detachment of the cover film (D), resulting in the formation of pinholes.

The term "surface energy" refers to an energy of molecules occurring in the surface which is excessive than that of molecules occurring inside. The level of the surface energy mainly depends on the level of intermolecular force. Therefore, the surface energy can be controlled by using materials having different intermolecular forces from each other. Examples of the material having a small intermolecular force and thus a small surface energy include a resin having a long-chain alkyl group, a silicone resin and a fluororesin. Examples of the material having a high intermolecular force and thus a high surface energy include a polyamide resin and a polyvinyl alcohol resin.

In light of the above statements, the surface energy of the cover film (D) can be controlled by applying a proper surface energy modifier on the surface of the cover film. As to the surface energy modifier, a component which has been used commonly as a mold release agent for a film can be used, as long as a desired range of surface energy can be achieved. For example, an acrylic resin, an alkyd resin, a polyester resin, an urethane resin, a polyamide resin, an amino resin, an epoxy resin, a silicone resin, a fluororesin, various wax, and an aliphatic olefin can be used. The surface energy modifier may be selected appropriately among these components, depending on a desired surface energy level on the basis of the above-mentioned measures. These surface energy modifiers may be used singly, or two or more of them may be used in combination. Among these components, an acrylic resin is preferred. As to the acrylic resin, a long-chain alkyl (preferably having 12 to 22 carbon atoms) acrylate-copolymerized alkyl resin is preferred, from the viewpoint that the surface energy modification effect is apt to be exerted. As to the long-chain alky acrylate-copolymerized alkyl resin, a commercially available product may be used, and a preferred example is Peeloil (manufactured by Lion Corporation).

The measurement of the surface energy of the cover film (D) is performed in accordance with a determination method using a wetting reagent (Plastics—Film and sheeting—Determination of wetting tension) prescribed in JIS K6768.

If the surface roughness (Ra) of the cover film (D) is less than the above-mentioned range, the cover film is too smooth and therefore the slipperiness of the film is lost. As a result, the formation of pinholes is apt to occur in a processing process. If the surface roughness (Ra) of the cover film (D) is more than the above-mentioned range, a liquid cannot be spread uniformly during the application of the heat-sensitive mask layer (C) and therefore the formation of pinholes is apt to occur. In addition, the pressure at a convex part is increased upon the contact with rolls in a processing process, and therefore the convex part is apt to be scratched.

The surface roughness of the cover film (D) can be controlled by using cover films having different surface roughness, or by applying fine particles on the surface of the cover film (D) to adjust the surface roughness. An example of the method for producing cover films having different surface roughness is a method in which a PET film is treated with an alkaline agent. In this case, the time of the surface roughness can be controlled by adjusting the time of treatment with an alkaline agent or the concentration of the alkaline agent. As to the method for applying fine particles, EPOSTAR (heat-cured resin spherical fine particles made from a melamine resin and a benzoguanamine resin) sold by Nippon Shokubai Co., Ltd. can be used as the fine particles. An EPOSTAR series is distributed on the market in different trade names having different particle sizes. Therefore, the surface roughness can be controlled by varying the particle diameters or blend amounts of the EPOSTAR products. The measurement of the surface roughness (Ra) of the cover film (D) is performed in a non-contact mode, not in a contact mode. This is because a cover film which is to be measured with respect to surface roughness (Ra) in the present invention is relatively soft. If the contact mode is employed, the cover film will be deformed as the result of the contact with a probe in a measurement device, and therefore the surface roughness (Ra) cannot be measured accurately. More specifically, a confocal-mode method using a confocal laser scanning microscope is employed among non-contact mode methods. The measurement principle of this method is described in detail on Homepage of Keyence Corporation (https://www.keyence.co.jp/ss/products/microscope/roughness/equipment/no-contact.jsp). In brief, a two-dimensional image (X-axis, Y-axis) is measured, and then the image is moved in the Z-axis direction (depth direction) by a specified width at a specified pitch so as to produce a plurality of two-dimensional images having different Z-axis directions from each other. These two-dimensional images are connected with each other so as to produce three-dimensional information.

The protection layer (E) to be used in the flexographic printing plate precursor of the present invention is arranged directly on a surface of the heat-sensitive mask layer (C) which is opposed to a surface thereof that contacts with the cover film (D), and thus will be arranged between the heat-sensitive mask layer (C) and the photosensitive resin layer (B) after the processing into a printing plate precursor. The protection layer (E) according to the present invention is formed from a polymer compound that is dispersible in a developing solution, and thus will be removed during a developing process. The heat-sensitive mask layer (C) contains many particles such as carbon black particles because of the characteristic properties thereof, and is therefore a very brittle film. Therefore, in the present invention, the protection layer (E) is provided so as to protect the heat-sensitive mask layer (C) from a force generated upon the contact with rolls during a processing process and prevent the heat-sensitive mask layer (C) from scratching (the formation of pinholes).

Examples of the method for providing the protection layer (E) on a surface of the heat-sensitive mask layer (C) which is opposed to a surface thereof that contacts with the cover film (D) include: a method in which a dissolved solution having ingredients of the protection layer (E) dissolved therein is applied and dried on a surface of the heat-sensitive mask layer (C) which is opposed to a surface thereof that contacts with the cover film (D) so as to form the protection layer (E); and a method in which a protection layer (E) which is prepared in advance is bonded to a surface of the heat-sensitive mask layer (C) which is opposed to a surface thereof that contacts with the cover film (D). Among these methods, the former method is preferred, because the protection layer (E) is simply formed by application and drying.

The thickness of the protection layer (E) is preferably 0.2 to 15 μm. If the thickness is less than 0.2 μm, the scratching of the heat-sensitive mask layer (C) (the formation of pinholes) cannot be prevented fully. If the thickness is more than 15 μm, it may be difficult to remove the protection layer (E) in the developing step.

As to the material for the protection layer (E), any conventional known material can be used as long as the material is a polymer compound dispersible in a developing solution. For example, polyurethane, polyamide, polyester, polybutadiene, polyacrylonitrile, polystyrene, polybutadiene-styrene, an acrylic polymer, polyvinyl alcohol, a partially saponified vinyl acetate polymer, an alkyl cellulose, a cellulose-based polymer, and various modification products of these polymer compounds can be used. These polymers may not be always used singly, or a combination of two or more of these polymers may be used.

Although a method for producing the flexographic printing plate precursor of the present invention is not particularly limited, it may be produced, for example, as mentioned below.

Firstly, components of heat-sensitive mask layer (C) such as binder other than the carbon black are dissolved in a suitable solvent, and then the carbon black is dispersed therein so as to prepare a dispersion. Then the dispersion is applied onto a cover film (D). Then the solvent is evaporated therefrom. After that, a component for the protection layer (E) is applied thereon whereupon one laminate is prepared. Further, apart therefrom, the photosensitive resin layer (B) is formed on another support (A) by means of application whereupon another laminate is prepared. The prepared two laminates are layered under pressurization and/or heating in such a manner that the photosensitive resin layer (B) adjacently contacts the protection layer (E). Incidentally, after completion of the printing plate precursor, the cover film (D) functions as a protective film for a surface thereof.

Now, a method for producing a flexographic printing plate from this flexographic printing plate precursor produced as mentioned above will be explained. Firstly, the cover film (D) is removed from the flexographic printing plate precursor. Thereafter, the heat-sensitive mask layer (C) is imagewise-irradiated with an IR laser so that a mask is formed on the photosensitive resin layer (B). Preferable examples of the IR laser include an ND/YAG laser (1064 nm) and a diode laser (for example, 830 nm). A laser system suitable for the Computer to Plate Technique is commercially available, and, for example, CDI (manufactured by Esko-Graphics Co., Ltd.) may be used. This laser system includes a rotation cylinder drum used for holding a printing plate precursor, an IR laser irradiating device and a layout computer. Pattern information is directly transferred from the layout computer to the laser device.

After the pattern information has been written in the heat-sensitive mask layer (C), the entire surface of the flexographic printing plate precursor is irradiated with active light rays via the imagewise-mask (main exposure). This process may be carried out with the plate attached to the laser cylinder. Alternatively, a method is also applicable in which, after the plate has been removed from the laser device, the irradiation process is carried out by using a commonly-used irradiation unit having a flat plate shape. Examples of the active light rays include: ultraviolet rays having an emission peak at a wavelength in a range from 330 to 380 nm. Examples of its light source include: an LED, a low-pressure mercury lamp, a high-pressure mercury lamp, a super-high pressure mercury lamp, a metal halide lamp, a xenon lamp, a zirconium lamp, a carbon arc lamp and an ultraviolet-ray fluorescent lamp. Thereafter, the irradiated plate is developed, subjected to finishing exposure, and subjected to exposure with a germicidal lamp whereby the printing plate is obtained. The development step can be performed with a conventional development unit.

When a microcell is used, a proper microcell is selected from various microcells installed in CDI (ESKO Graphics) and then the selected microcell is applied to an image on a computer, and the image is used for imaging onto a heat-sensitive mask layer.

In a flexographic printing plate prepared as above, pinholes each having a size of 7,000 $\mu m^2$ or more do not exist in the heat-sensitive mask layer (C), and wherein the number of pinholes each having a size of 2,000 $\mu m^2$ or more and less than 7,000 $\mu m^2$ is 5 pinholes/$m^2$ or less in the heat-sensitive mask layer (C). Because pinholes each having a size of 7000 $\mu m^2$ (radius: 47 $\mu m$) or more do not exist in the heat-sensitive mask layer (C), any serious problem is not caused even when a microcell is applied. In addition, by suppressing the number of pinholes each having a size of 2000 $\mu m^2$ (radius: 25 $\mu m$) or more and less than 7000 $\mu m^2$ (radius: 47 $\mu m$) to 5 pinholes/$m^2$ or less in the heat-sensitive mask layer (C), the influence on the microcell can be eliminated. The number of the pinholes is preferably 3 or less, more preferably zero. By using a flexographic printing plate in which the size and the number of the pinholes are reduced, a flexographic printing plate free from the disadvantages caused by the pinholes can be produced.

EXAMPLES

As hereunder, the effects of the printing plate of the present invention will be illustrated by referring to the following Examples although the present invention is not limited to those Examples. A term "part(s)" in Examples stand(s) for part(s) by mass. Values shown in Tables which indicate a composition ratio also stand for part(s) by mass.

Evaluation in Examples was done in accordance with the following methods.

(1) Measurement of Surface Energy of Cover Film

The measurement of the surface energy of the cover film was performed in accordance with JIS K6768 using a mixed liquid for wetting tension test (manufactured by KANTO CHEMICAL CO., INC.). Specifically, two drops of each of the mixed liquid for wetting tension tests with a wetting tension of 22.6 mN/m, 25.4 mN/m, 27.3 mN/m, and 30 mN/m to 54 mN/m at 1 mN/m intervals, respectively were dropped onto a surface of the cover film which is intended to contact with the heat-sensitive mask layer, under the atmosphere of 20° C. and 60 RH %. Then, the drops were spread with a cotton-tipped swab, and the wet spreadability of each of the mixed liquid was observed with naked eyes. The numerical value of the wetting tension of the mixed liquid which were repelled was employed as a surface energy of the cover film.

(2) Surface Roughness (Ra) of Cover Film

The measurement of the surface roughness (Ra) of the cover film is performed in a confocal-mode method using a confocal laser scanning microscope. More specifically, as to the confocal laser scanning microscope, a confocal laser scanning microscope VK9510 manufactured by Keyence Corporation was used. The magnification of the objective lens was ×50. A sample film having a size of 10 cm long×10 cm wide was cut out from the cover film. The sample film was placed on a measurement table in the confocal laser scanning microscope. The measurement was performed while moving the sample film in the vertical direction and/or the lateral direction by about 5 mm. The surface roughness (Ra) was measured at 20 points in total. An average of the measurement values was determined, and the result was employed as the surface roughness (Ra) of the cover film.

(3) Pinholes in Heat-Sensitive Mask Layer

The cover film was detached from the printing plate precursor. Then, the printing plate precursor was enlarged at a magnification of ×200 with transmitted light using a digital microscope VHK-5000 manufactured by Keyence Corporation, and the size and number of pinholes in the heat-sensitive mask layer were measured. The size of the sample was 1 m long×1 m wide. The measurement was performed at arbitrary 50 points, and an average of the measurement values was determined.

(4) Influence of Pinholes on Printing Plate

A printing plate was produced from the printing plate precursor by the below-mentioned method. A solid-printed part on the printing plate to which a microcell was applied was enlarged at a magnification of ×200 using a digital microscope (VHX5000) manufactured by Keyence Corporation. The influence of pinholes on the printing plate was evaluated in accordance with the following criteria. The size of the sample was 1 m long×1 m wide.

⊙⊙: any defect caused by pinholes was not observed.
○: slight defects caused by pinholes were observed in an amount of less than 3 pinholes/$m^2$.
Δ: defects caused by pinholes were observed in an amount of 3 to 10 pinholes/$m^2$.
x: defects caused by pinholes were observed in an amount of more than 10 pinholes/$m^2$.

Example 1

Preparation of Photosensitive Resin Composition

A butadiene latex (Nipol LX111NF, non-volatile content: 55%, manufactured by Zeon Corporation) (86 parts by mass) that served as the polymer prepared by polymerizing a conjugated diene, an acrylonitrile-butadiene latex (Nipol SX1503, non-volatile content: 42%, manufactured by Zeon Corporation) (24 parts by mass) that served as the polymer prepared by polymerizing a conjugated diene, a polybutadiene-terminal acrylate having a number average molecular weight of 10000 (BAC45, manufactured by Osaka Organic Chemical Industry Ltd.) (15 parts by mass) that served as an ethylenically unsaturated compound, trimethylolpropane trimethacrylate having a number average molecular weight of 338 (Light Ester TMP, manufactured by Kyoeisha Chemical Co., Ltd.) (10 parts by mass) that served as ethylenically unsaturated compound, benzyl dimethylketal (3 parts by mass) that served as a photopolymerization initiator, and a hydrophilic polymer (PFT-4, non-volatile content: 25%, manufactured by Kyoeisha Chemical Co., Ltd.) (20 parts by mass), a butadiene oligomer (B2000, manufactured by Nippon Soda Co., Ltd.) (9.9 parts by mass), a thermal stabilizer (4-methoxyphenol) (0.1 part by mass), and an ultraviolet ray absorber (Tinuvin 326) (0.01 part by mass) that served as auxiliary components were mixed together in a container so as to produce a dope. The dope was charged into a pressurized kneader, and then the solvent was removed under a reduced pressure at 80° C. so as to produce a photosensitive resin composition.

Preparation of Heat-Sensitive Mask Layer Coating Solution

Carbon black dispersion (AMBK-8 manufactured by ORIENT CHEMICAL INDUSTRIES CO., LTD.), copolymerized polyamide (PA223 manufactured by TOYOBO CO., LTD.), propylene glycol, and methanol were mixed at a mass proportion of 45/5/5/45 so as to obtain an heat-sensitive mask layer coating solution.

Protection Layer Coating Solution

An urethane resin emulsion (PERMARIN UA-200, solid content: 30%, manufactured by Sanyo Chemical Industries, Ltd.) was used.

Preparation of Cover Film

As to a material film for the cover film, a polyester film (Cosmo Shine A4100, thickness: 100 μm, manufactured by Toyobo Co., Ltd.) was used. Cosmo Shine was subjected to a chemical etching treatment so that the surface roughness of a smooth surface of Cosmo Shine became 0.07 μm. Peeloil 1050 (a long-chain alkyl pendant type, manufactured by Lon Corporation) of which the solid content was adjusted to 0.5% was applied as a release agent onto the smooth surface of Cosmo Shine having a surface roughness of 0.07 μm at a wet coating amount of 3 g/m² with a micro gravure, and the resultant product was dried at 100° C. for 2 minutes so as to produce a cover film. The surface on which Peeloil was applied was a surface on which a heat-sensitive mask layer is to be provided. This surface had a surface energy of 32 mN/m and a surface roughness of 0.07 μm.

Preparation of Film Laminate (I)

The heat-sensitive mask layer coating solution mentioned above was applied on the cover film so that the thickness of a coating film after drying became 2 μm, and the resultant product was then dried at 120° C. for 5 minutes so as to form a heat-sensitive mask layer on the cover film. Subsequently, the above-mentioned protection layer coating solution was applied as a protection layer in such a manner that the thickness of the coating solution became 4 μm so as to form a film laminate (I).

Preparation of Support Having Adhesive Layer Attached Thereto

A copolymerized polyester-based adhesive agent was applied on a polyester film (thickness: 125 μm) so as to produce a support having an adhesive layer attached thereto.

Preparation of Printing Plate Precursor

A photosensitive resin was continuously supplied between the film laminate (I) and the support having the adhesive layer attached thereto, and a printing plate precursor (thickness: 1.14 mm) was produced continuously with a calender roll. The protection layer on the heat-sensitive mask layer in the film laminate (I) passed through rolls for adjusting the tension at a position in front of the calender roll while contacting with the rolls. The cover film was removed from the printing plate precursor, and the number of pinholes was evaluated. The number of pinhole having a size of 2,000 μm² or more was 0 pinhole/m².

Production of Printing Plate from Flexographic Printing Plate Precursor

The printing plate precursor was subjected to back exposure from the PET support side for 10 seconds. Subsequently, the cover film was peeled off. This printing plate was wound around CDI4530 manufactured by ESCO Graphics, and the imaging was performed at a resolution of 4000 dpi. As to the imaged pattern, an image having solid-printed parts to which a microcell was applied was used. The main exposure was performed using an LED built in CDI4530 at a luminance of 22 mW/cm² for 480 seconds. After that, the plate was detached from CDI, and development was performed for 8 minutes using a developing machine (Stuck System, 1% aqueous washing soap solution, 40° C.) manufactured by A & V Co., Ltd., and water droplets on the plate surface were removed with a drain stick. Thereafter, the plate was dried in a dryer at 60° C. for 10 minutes, subjected to finishing exposure for 7 minutes, and finally irradiated with light from a germicidal lamp for 5 minutes, whereby a flexographic printing plate was thus obtained. The back exposure and finishing exposure were performed using TL-K 40W/10R lamp (peak wavelength: 370 nm, luminance at 350 nm: 10 mW/cm²) manufactured by Philips. As to the germicidal lamp, a germicidal lamp GL-40 (peak wavelength: 250 nm, luminance at 250 nm: 4.5 mW/cm²) manufactured by Panasonic Corporation was used. It was confirmed that the relief depth of the resultant printing plate was 0.6 mm. Evaluation results are shown in Table 1.

Example 2

The same procedure as in Example 1 was performed, except that Peeloil 1010 (a long-chain alkyl pendant type, manufactured by Lon Corporation) was used in place of Peeloil 1050 (a long-chain alkyl pendant type, manufactured by Lon Corporation) in the preparation of a cover film. Evaluation results are shown in Table 1.

Example 3

The same procedure as in Example 1 was performed, except that Peeloil HT (an acryl type, manufactured by Lon Corporation) was used in place of Peeloil 1050 (a long-chain alkyl pendant type, manufactured by Lon Corporation) in the preparation of a cover film. Evaluation results are shown in Table 1.

Example 4

The same evaluation as in Example 1 was performed, except that the polyester film that was a material film (Cosmo Shine A4100, thickness: 100 μm, manufactured by Toyobo Co., Ltd.) was not subjected to a chemical etching treatment in the preparation of a cover film. Evaluation results are shown in Table 1.

Example 5

In the preparation of a cover film, the polyester film that was a material film (Cosmo Shine A4100, thickness: 100 μm, manufactured by Toyobo Co., Ltd.) was subjected to a chemical etching treatment so that the surface roughness of the film became 0.15 μm. The same evaluation as in Example 1 was performed using this material film. Evaluation results are shown in Table 1.

Example 6

In the preparation of a cover film, fine particles (EPOSTAR SS, a melamine-formaldehyde condensation product, manufactured by Nippon Shokubai Co., Ltd.) were coated on the polyester film that was a material film (Cosmo Shine A4100, thickness: 100 μm, manufactured by Toyobo Co., Ltd.) so as to adjust the surface roughness to 0.08 μm. The same evaluation as in Example 1 was performed using this film. Evaluation results are shown in Table 1.

Example 7

The same procedure as in Example 1 was performed, except that, as to a protection layer coating solution, a solution prepared by dissolving a water-soluble polyamide resin (P70, manufactured by Toray Industries, Inc.) at a solid content of 10% by mass was used in place of the urethane resin emulsion (PERMARIN UA-200, solid content: 30%, manufactured by Sanyo Chemical Industries, Ltd.). Evaluation results are shown in Table 1.

Example 8

The same method as in Example 1 was performed, except that, as to a protection layer coating solution, a solution prepared by dissolving a polyvinyl alcohol (JR-05 manufactured by Japan Vam & Poval Co., Ltd.) at a solid content of 10% by mass and adding polyglycerin (polyglycerin 310, manufactured by Sakamoto Yakuhin Kogyo Co., Ltd.) thereto in an amount of 30 parts by mass relative to 100 parts by mass of polyvinyl alcohol was used in place of the urethane resin emulsion (PERMARIN UA-200, solid content: 30%, manufactured by Sanyo Chemical Industries, Ltd.). Evaluation results are shown in Table 1.

Comparative Example 1

The same procedure as in Example 1 was performed, except that KS847 (a silicone type, manufactured by Shin-Etsu Chemical Co., Ltd.) was used in place of Peeloil 1050 (a long-chain alkyl pendant type, manufactured by Lon Corporation) in the preparation of a cover film. Evaluation results are shown in Table 1.

Comparative Example 2

The same method as in Example 1 was performed, except that Peeloil 1050 (a long-chain alkyl pendant type, manufactured by Lon Corporation) was not applied in the preparation of a cover film. Evaluation results are shown in Table 1.

Comparative Example 3

The same evaluation as in Example 1 was performed, except that the polyester film that was a material film (Cosmo Shine A4100, thickness: 100 μm, manufactured by Toyobo Co., Ltd.) was subjected to a chemical etching treatment so that the surface roughness of the film became 0.004 μm in the preparation of a cover film. Evaluation results are shown in Table 1.

Comparative Example 4

The same evaluation as in Example 1 was performed, except that the polyester film that was a material film (Cosmo Shine A4100, thickness: 100 μm, manufactured by Toyobo Co., Ltd.) was subjected to a chemical etching treatment so that the surface roughness of the film became 0.25 μm in the preparation of a cover film. Evaluation results are shown in Table 1.

Comparative Example 5

The same method as in Example 1 was performed, except that a protection layer was not provided in the preparation of a film laminate (I). Evaluation results are shown in Table 1.

TABLE 1

| | | Examples | | | |
|---|---|---|---|---|---|
| | | 1 | 2 | 3 | 4 |
| Type of protection layer | | urethane resin | urethane resin | urethane resin | urethane resin |
| Properties of cover film | surface energy (mN/m) | 32 | 25.4 | 38 | 32 |
| | surface roughness (Ra) (μm) | 0.07 | 0.07 | 0.07 | 0.02 |
| Evaluation results | Pinholes in heat-sensitive mask layer (7,000 $μm^2$ or more) | 0 | 0 | 0 | 0 |
| | Pinholes in heat-sensitive mask layer (2,000 $μm^2$ or more and less than 7,000 $μm^2$) | 0 | 0 | 0 | 4 |
| | influence of pinholes on printing plate | ⊙ | ⊙ | ⊙ | ○ |

| | | Examples | | | |
|---|---|---|---|---|---|
| | | 5 | 6 | 7 | 8 |
| Type of protection layer | | urethane resin | urethane resin | polyamide resin | polyvinyl alcohol |
| Properties of cover film | surface energy (mN/m) | 32 | 32 | 32 | 32 |
| | surface roughness (Ra) (μm) | 0.15 | 0.08 | 0.07 | 0.07 |
| Evaluation results | Pinholes in heat-sensitive mask layer (7,000 $μm^2$ or more) | 0 | 0 | 0 | 0 |
| | Pinholes in heat-sensitive mask layer (2,000 $μm^2$ or more and less than 7,000 $μm^2$) | 0 | 0 | 0 | 0 |
| | influence of pinholes on printing plate | ⊙ | ⊙ | ⊙ | ⊙ |

| | | Comparative Examples | | | | |
|---|---|---|---|---|---|---|
| | | 1 | 2 | 3 | 4 | 5 |
| Type of protection layer | | urethane resin | urethane resin | urethane resin | urethane resin | absent |
| Properties of cover film | surface energy (mN/m) | 22.6 | 48 | 32 | 32 | 32 |
| | surface roughness (Ra) (μm) | 0.07 | 0.07 | 0.004 | 0.25 | 0.07 |
| Evaluation results | Pinholes in heat-sensitive mask layer (7,000 $μm^2$ or more) | 5 | 1 | 10 | 2 | 20 |
| | Pinholes in heat-sensitive mask layer (2,000 $μm^2$ or more and less than 7,000 $μm^2$) | 50 | 100 | 50 | 200 | 200 |
| | influence of pinholes on printing plate | Δ | Δ | Δ | Δ | x |

As is apparent from the evaluation results shown in the table, in Examples 1 to 8 in each of which the surface energy and the surface roughness (Ra) of a surface of the cover film which contacts with the heat-sensitive mask layer was within the ranges defined in the present invention and a protection layer was provided, the size and the number of pinholes in the heat-sensitive mask layer can be reduced and therefore a printing plate almost free from defects caused by the pinholes was produced.

In contrast, in Comparative Example 1, the surface energy was lower than the range defined in the present invention. Accordingly, the adhesion force between the heat-sensitive mask layer and the cover film was weak and scratches (pinhole) was formed upon the contact with rolls in a processing process. In Comparative Example 2, on the other hand, the surface energy was higher than the range defined in the present invention. Accordingly, the heat-sensitive mask layer transferred to the cover film side upon the detachment of the cover film from the printing plate precursor and, as a result, pinholes were formed in the printing plate precursor. In Comparative Example 3, the surface roughness of a surface of the cover film which contacts with the heat-sensitive mask layer was smaller than the range defined in the present invention. Accordingly, the cover film was too smooth and thus slipperiness of the film was lost and, as a result, pinholes were formed upon the contact with rolls in the processing process. In Comparative Example 4, the surface roughness of a surface of the cover film which contacts with the heat-sensitive mask layer was larger than the range defined in the present invention. Accordingly, a large force was applied to convex parts in the heat-sensitive mask layer upon the contact with rolls in the processing process and, as a result, scratches (pinholes) were formed. In Comparative Example 5, unlike Examples 1 to 8, any protection layer was not provided on the heat-sensitive mask layer, and therefore many scratches (pinholes) were formed upon the contact with a roll in the processing process.

INDUSTRIAL APPLICABILITY

In the flexographic printing plate precursor according to the present invention, the surface energy and the surface roughness (Ra) of a surface of the cover film which contacts with the heat-sensitive mask layer are adjusted to specific ranges, and a protection layer formed from a polymer compound dispersible in a developing solution is provided between the photosensitive resin layer and the heat-sensitive mask layer. Accordingly, it is possible to easily provide a flexographic printing plate precursor in which the size and the number of pinholes in a heat-sensitive mask layer are reduced. As a result, it is possible to provide a flexographic printing plate almost free from disadvantages caused by the pinholes. Therefore, the flexographic printing plate precursor of the present invention is very useful in the industrial field.

The invention claimed is:

1. A flexographic printing plate precursor comprising at least a support (A), a photosensitive resin layer (B), a heat-sensitive mask layer (C) and a cover film (D) which are laminated in this order, characterized in that the surface energy and the surface roughness (Ra) of a surface of the cover film (D) which contacts with the heat-sensitive mask layer (C) are 25.0 to 40.0 mN/m and 0.01 to 0.2 μm, respectively, and that a protection layer (E) formed from a polymer compound dispersible in a developing solution is provided between the photosensitive resin layer (B) and the heat-sensitive mask layer (C), and that at least one polymer selected from the group consisting of polyurethane, polyester, polybutadiene, polyacrylonitrile, polystyrene, polybutadiene-styrene, an acrylic polymer, an alkyl cellulose, a cellulose-based polymer, and various modification products thereof is used as the polymer compound forming the protection layer (E).

2. The flexographic printing plate precursor according to claim 1, wherein pinholes each having a size of 7,000 μm$^2$ or more do not exist in the heat-sensitive mask layer (C), and wherein the number of pinholes each having a size of 2,000 μm$^2$ or more and less than 7,000 μm$^2$ is 5 pinholes/m$^2$ or less in the heat-sensitive mask layer (C).

3. A flexographic printing plate obtained from the flexographic printing plate precursor according to claim 1.

4. The flexographic printing plate according to claim 3, wherein the flexographic printing plate has been obtained by developing the flexographic printing plate precursor using a water-based developing solution.

5. A method for producing a printed matter, characterized in that the method uses the flexographic printing plate according to claim 3.

* * * * *